(12) United States Patent
Levin et al.

(10) Patent No.: US 12,308,278 B1
(45) Date of Patent: May 20, 2025

(54) UNIVERSAL RING WAFER SUPPORT APPARATUS

(71) Applicant: GREEN TECHNOLOGY INVESTMENTS, LLC, Scottsdale, AZ (US)

(72) Inventors: Tal Levin, Scottsdale, AZ (US); Sorin Tohatan, Scottsdale, AZ (US)

(73) Assignee: GREEN TECHNOLOGY INVESTMENTS, LLC, Scottsdale, AZ (US)

( * ) Notice: Subject to any disclaimer, the term of this patent is extended or adjusted under 35 U.S.C. 154(b) by 0 days.

(21) Appl. No.: 18/776,280

(22) Filed: Jul. 18, 2024

(51) Int. Cl.
*H01L 21/683* (2006.01)
*H01L 21/687* (2006.01)

(52) U.S. Cl.
CPC .... *H01L 21/68785* (2013.01); *H01L 21/6838* (2013.01); *H01L 21/68757* (2013.01); *H01L 21/68735* (2013.01); *H01L 21/6875* (2013.01)

(58) Field of Classification Search
CPC ........... H01L 21/68735; H01L 21/6838; H01L 21/6875; H01L 21/67103; H01L 21/67109; H01L 21/6831; H01L 21/68785
See application file for complete search history.

(56) References Cited

U.S. PATENT DOCUMENTS

| | | | |
|---|---|---|---|
| 9,757,865 B1* | 9/2017 | Chen | H01L 21/68785 |
| 11,222,772 B2* | 1/2022 | Kim | H01J 37/32467 |
| 11,600,510 B2* | 3/2023 | Ito | H01J 37/32724 |
| 2021/0143044 A1* | 5/2021 | Oka | H01L 21/68721 |
| 2021/0242064 A1* | 8/2021 | Ito | H01J 37/32724 |

FOREIGN PATENT DOCUMENTS

| | | | |
|---|---|---|---|
| CN | 102270596 B | * | 9/2013 |
| JP | 2002141332 A | * | 5/2002 |
| KR | 20110080132 A | * | 7/2011 |

* cited by examiner

*Primary Examiner* — Mahdi H Nejad
(74) *Attorney, Agent, or Firm* — Stanzione & Associates, PLLC; Patrick Stanzione

(57) ABSTRACT

A universal ring wafer support apparatus that includes at least one raised support to securely support different size wafers above and separated from the main body to enable dust, particles and contaminants to flow away from a wafer and through the main body to a back side thereof. The universal ring wafer support apparatus and the at least one raised support is formed of a highly conductive material while a top surface of the at least one raised support includes contact material(s) or pucks having a high gripping force to grip and securely support a wafer thereon.

7 Claims, 11 Drawing Sheets

FIG. 1
(CONVENTIONAL)

FIG. 2
(CONVENTIONAL)

FIG. 3
(CONVENTIONAL)

FIG. 4
(CONVENTIONAL)

FIG. 5
(CONVENTIONAL)

UNIVERSAL RING WAFER SUPPORT APPARATUS

STATEMENT REGARDING FEDERALLY SPONSORED RESEARCH OR DEVELOPMENT

Not applicable.

COPYRIGHT NOTICE

A portion of this disclosure contains material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever. 37 C.F.R 1.71 (d).

BACKGROUND OF THE INVENTIVE CONCEPT

1. Field of the Invention

The present inventive concept relates to a specifically configured universal ring wafer support apparatus. More particularly, but not exclusively, the present inventive concept relates to a universal ring wafer support apparatus that ensures robust grounding of wafers, minimizes outgassing-related issues and mitigates risks of contamination transfer in order to enhance reliability and cleanliness of semiconductor fabrication processes.

2. Description of the Related Art

Scanning electron microscopy (SEM) tools/instruments deployed within fabrication facilities are pivotal in enabling microscopic analysis and characterization of semiconductor wafers. At the heart of these instruments lies a seemingly simple yet profoundly crucial component: the wafer support unit (also referred to as a wafer chuck or wafer holder). Despite their unassuming appearance, wafer supports play a pivotal role in ensuring the integrity and fidelity of microscopic observations and measurements of semiconductor wafers.

A primary function of a wafer support is to provide a stable and precisely controlled platform for securing semiconductor wafers during imaging and analysis processes. In the dynamic environment of an SEM, where electron beams scan across the surface of the sample with exquisite precision, even the slightest perturbations or vibrations can compromise the integrity of acquired data. The wafer support acts as a steadfast anchor, mitigating mechanical oscillations and ensuring that the wafer remains immobile during imaging procedures. By minimizing undesired movements and vibrations, wafer supports facilitate the attainment of high-resolution images and accurate measurements, thereby underpinning the integrity of subsequent analyses and interpretations of a wafer's quality and reliability.

Wafer supports also contribute to rigorously controlling semiconductor fabrication environments to minimize contamination and maintain the purity of fabricated devices by serving as a protective barrier between the semiconductor wafer and the surrounding environment. Through judicious material selection and design considerations wafer supports are engineered to minimize the generation and deposition of contaminants onto the surface of a wafer. Moreover, certain wafer support technologies, such as vacuum chucks or electrostatic clamps, facilitate wafer fixation without physical contact, further reducing the risk of contamination. By safeguarding the cleanliness and purity of the wafer, these supports uphold the stringent quality standards mandated within semiconductor fabrication facilities.

Semiconductor fabrication encompasses a diverse array of processes, each imposing distinct requirements on the instrumentation utilized. Wafer support(s) are designed to accommodate this heterogeneity, offering versatility and adaptability to suit various imaging modalities and sample configurations. Whether conducting topographical analyses, elemental mapping, or defect inspections, SEM tools must be equipped with wafer supports capable of accommodating different sample sizes, shapes, and compositions. Moreover, advancements in wafer support technologies have facilitated the integration of temperature control mechanisms, enabling precise manipulation of sample temperature during imaging procedures. This versatility empowers semiconductor fabrication facilities to conduct a myriad of analyses with unparalleled flexibility and precision.

In the intricate ecosystem of semiconductor fabrication, where nanoscale intricacies dictate device performance and reliability, the significance of wafer supports within scanning electron microscopy tools cannot be overstated. Beyond mere mechanical fixtures, wafer supports should embody the *nexus* of stability, cleanliness, and adaptability, imbuing SEM instruments with the capacity to unveil the microscopic intricacies of semiconductor wafers with unparalleled fidelity and precision. As semiconductor technologies continue to evolve and diversify, the role of wafer supports will persist as a linchpin in the quest for innovation and excellence within semiconductor fabrication facilities.

Figure 1:
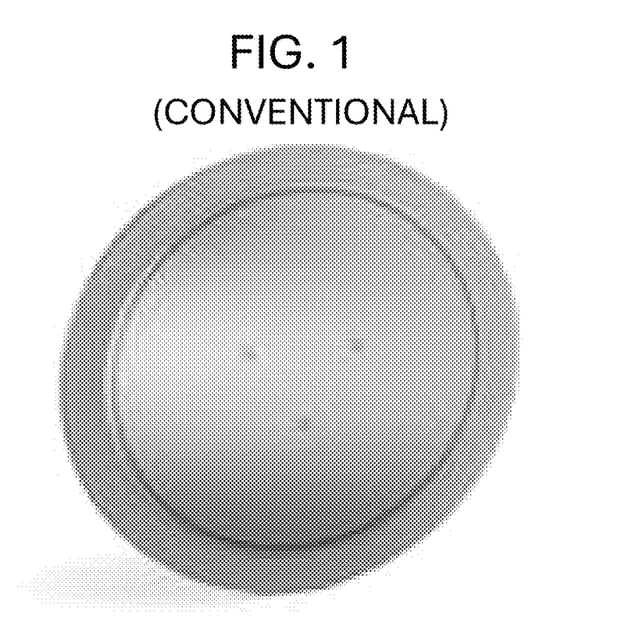
FIG. 1 illustrates a conventional vacuum chuck support.

FIG. 1 illustrates a conventional vacuum chuck support. Although this conventional vacuum chuck support provides uniform and reliable wafer fixation, is suitable for various wafer sizes and shapes, and provides minimal contact with a wafer surface to reduce contamination risks, this type of vacuum chuck support requires a separate vacuum system, which adds complexity and costs, and may not be suitable for extremely thin or fragile wafers.

Figure 2:
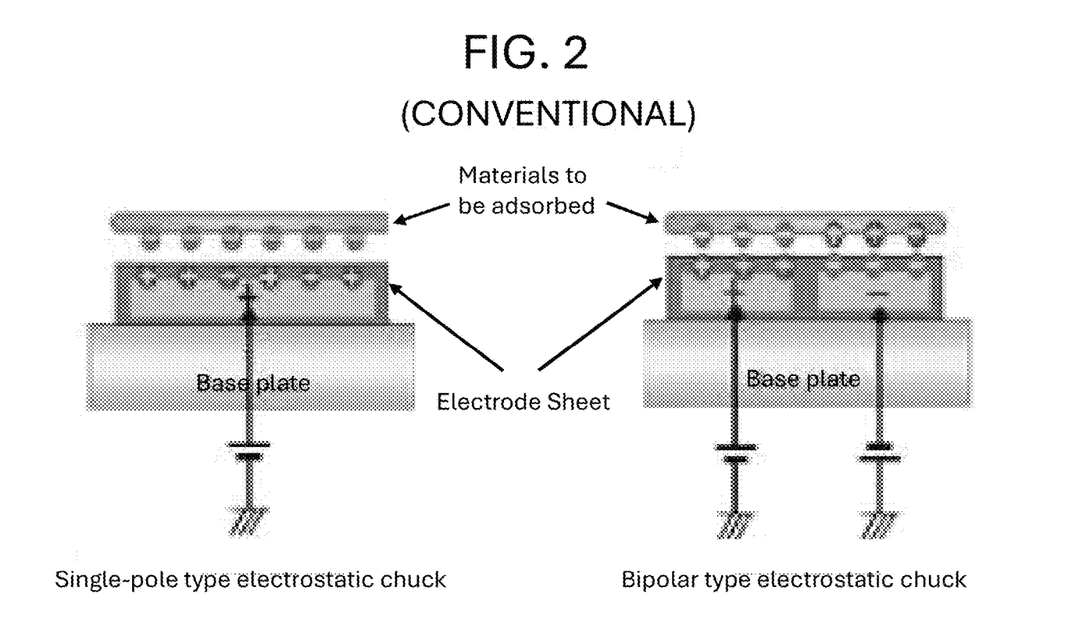
FIG. 2 illustrates a conventional electrostatic chuck (ESC) support.

FIG. 2 illustrates a conventional electrostatic chuck (ESC) support. This type of chuck support can provide a strong holding force without physical contact, a high positional accuracy stability and is compatible with most wafer materials. However, this the ESC chuck support is vulnerable to electrostatic discharge (ESD) issues, is complex in voltage control and management, and is limited in applicability to conductive wafers.

Figure 3:
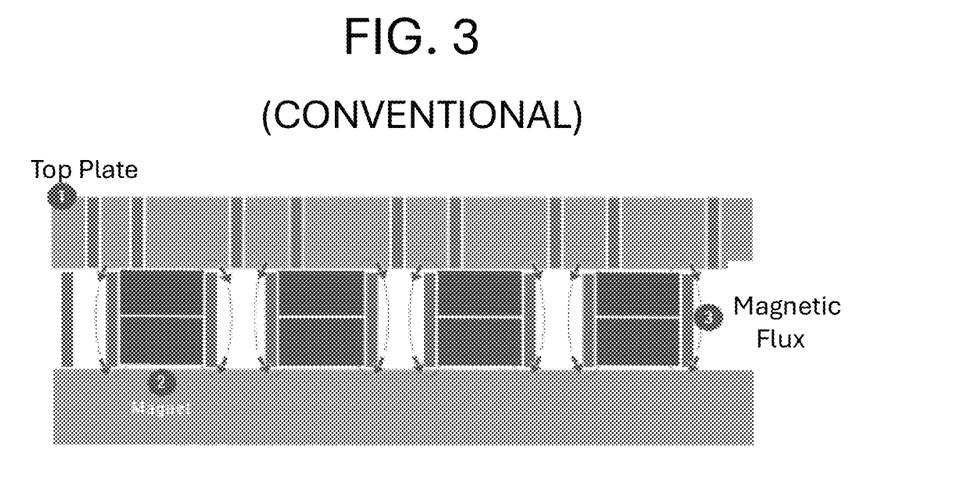
FIG. 3 illustrates a conventional magnetic chuck support.

FIG. 3 illustrates a conventional magnetic chuck support. Magnetic chuck supports may provide a uniform holding force across an entire surface of a wafer, a minimal risk of wafer damage, and is suitable for thin fragile wafers. However, magnetic chuck supports require a strong magnetic field, which may interfere with sensitive equipment. Further, magnetic chuck supports are limited in compatibility with non-magnetic materials and are susceptible to magnetic interference and vibration.

Figure 4:
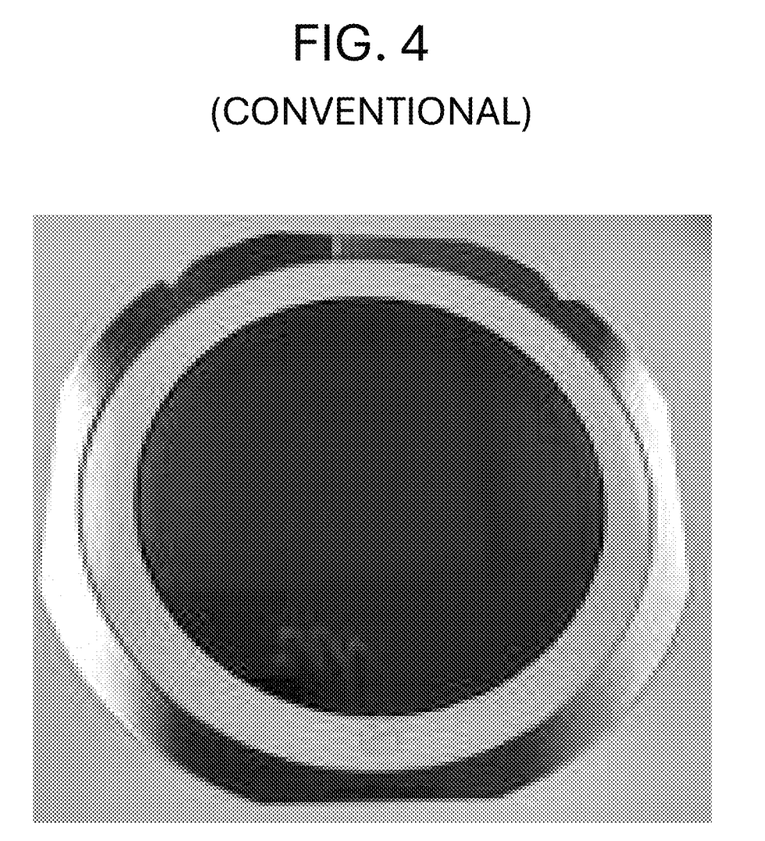
FIG. 4 illustrates a conventional wafer frame support.

FIG. 4 illustrates a conventional "wafer frame support." This type of support can provide the ability to handle multiple wafers simultaneously, can provide good support and stability, and can provide ease in loading and unloading of wafers. However, wafer frame supports require additional space for frame storage and handling, are limited in flexibility for individual wafer processing, and provide the potential for increased risk of contamination.

Figure 5:
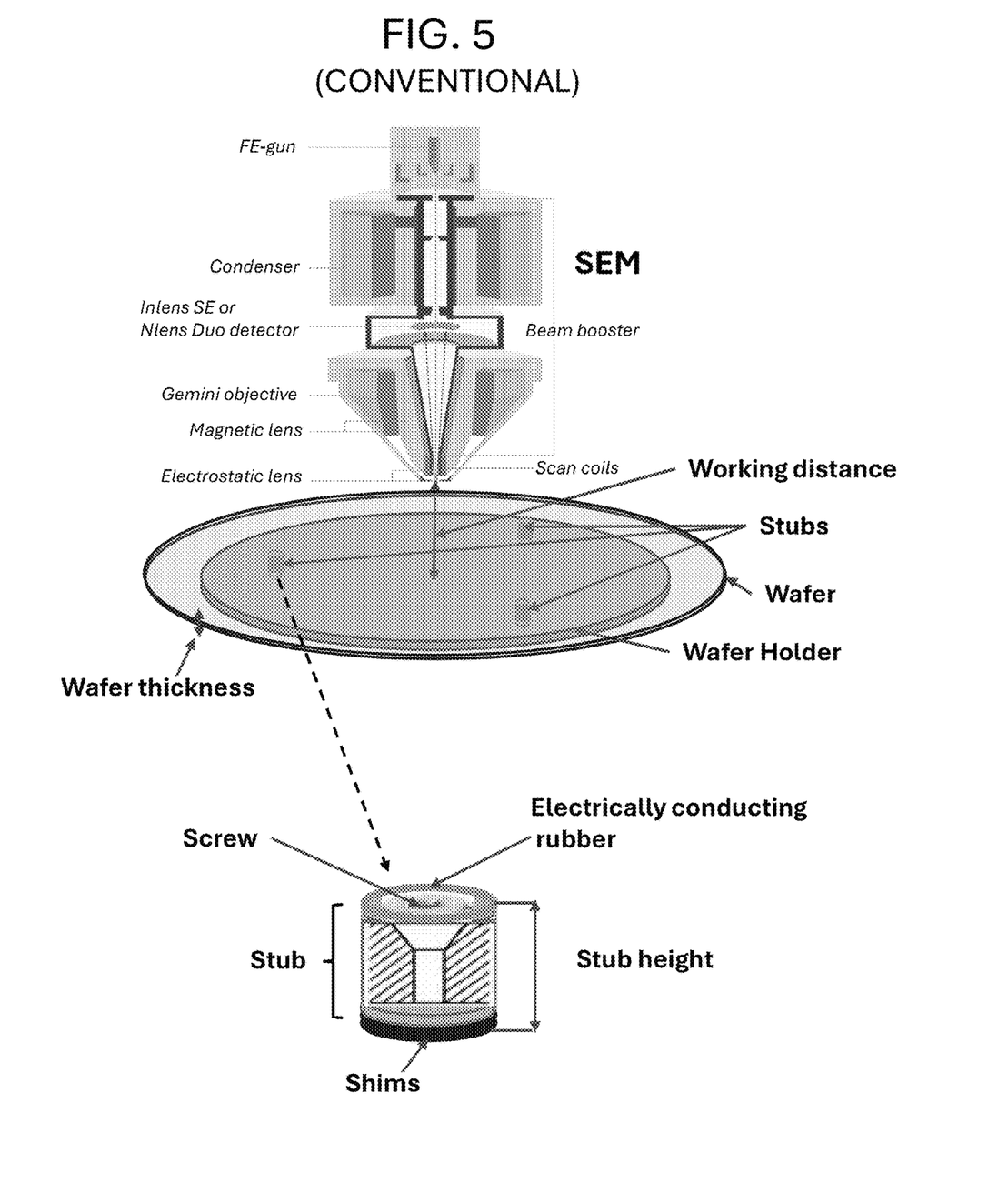
FIG. 5 illustrates an elevated view of a conventional wafer frame support.

FIG. 5 illustrates an elevated view of a conventional wafer frame support. The limitations of wafer frame supports are noteworthy, despite achieving moderate to excellent scores for most parameters. Their application with precise tasks, such as scanning electron microscopy (SEM), reveals certain inherent drawbacks dictated by their operational principles. One of the most critical dimensional relationships within the SEM environment is the relationship between the SEM system, the wafer support, and the wafer itself. At the heart of optimal image acquisition lies the concept of the working distance, a fundamental parameter meticulously optimized by OEM manufacturers for specific tool types. This optimization aims to strike a delicate balance between stability and detectability, as the working distance profoundly influences resolution and depth of focus.

To harness the benefits of this optimized working distance, the semiconductor wafer must be precisely positioned beneath the SEM and secured on wafer support stubs at the required distance. However, adjusting or changing the working distance is no trivial task, for example, it entails a cumbersome procedure involving chamber ventilation and meticulous mechanical adjustment of shims on the stubs. Verification of the adjusted working distance necessitates a meticulous reversal of these steps, further adding to the complexity of the operation.

Moreover, while a wafer's thickness typically remains a stable parameter within certain technologies, the advent of novel processes based on non-silicon substrates introduces a new layer of complexity. These processes may require adjustments to the heights of wafer support stubs to maintain the proper working distance of a wafer. Additionally, even within the realm of silicon technology, variations in wafer sizes necessitate different placements of the wafer support stubs. Smaller wafer sizes, for instance, may require closer placement of the stubs to ensure proper support of the wafer. For large-scale silicon manufacturers, maintaining high-volume production necessitates dedicating CD (Critical Distance) and DR (Defect Review) SEMs to specific technologies, ensuring that the working distance remains unchanged throughout manufacturing. However, for smaller suppliers or development labs, the current setup for wafer supports poses significant challenges. It complicates the manufacturing and development processes, often requiring tool dedication and resulting in increased maintenance costs. Consequently, many smaller entities find themselves grappling with the logistical and financial burdens associated with supporting diverse technologies and wafer sizes within their SEM infrastructure.

Expanding upon the importance of design considerations for wafer support stubs, it is crucial to underscore the significance of their grounding ability, particularly in light of evolving substrate materials and contamination concerns. While the current wafer support stub configuration adequately provides grounding connectivity at specific points, the emergence of new substrate materials with lower conductivity demands enhanced grounding capabilities. Improved grounding not only ensures the integrity of measurement and inspection processes but also safeguards against potential electrostatic discharge (ESD) events that could compromise sensitive semiconductor components.

Moreover, the composition of the wafer support plate warrants scrutiny, as its solid stainless steel or aluminum surface introduces weight considerations, particularly concerning the linear stage motors. However, the primary concern with a solid plate lies in its propensity for outgassing, a phenomenon where minute volumes of gases are released within the vacuum environment, leading to vacuum spikes. This outgassing can prove problematic and can be initiated as a result of critical operations such as wafer coating, particularly on lithography stages where resist integrity is paramount.

Of equal concern is the potential for contamination arising from the interaction between the backside of the wafer and the solid plate. While traditionally, the backside of the wafer may have held little significance in semiconductor processes, ongoing research suggests its utilization as an integral part of certain processes. In such cases, the relative proximity between the backplate and the solid plate creates an extended contamination area, facilitating the transfer of contaminants between successive wafers. To mitigate this risk, a more open pumping route for the backside of the wafer is imperative, allowing for efficient removal of outgassed particles and minimizing the risk of contamination propagation.

In the intricate realm of semiconductor fabrication, where nanoscale precision is paramount, the demand for ultra-precision mechanical wafer supports is unparalleled. These supports need to stand as stalwart sentinels, entrusted with the task of orchestrating meticulously controlled wafer placement for repeatable operations within semiconductor fabrication facilities. Several challenges and limitations arise when employing the conventional and current wafer support technologies in semiconductor microscopy under vacuum conditions, such as, for example: a) certain wafer support materials may outgas in vacuum environments, contaminating semiconductor samples, and degrading imaging quality; b) wafer support mechanisms, such as lead screws and linear guides, may experience reduced performance or failure due to vacuum-induced stress or deformation; c) wafer support components may generate friction or particulate contamination, compromising imaging accuracy and cleanliness in ultra-clean vacuum environments; and d) variations in temperature within the vacuum chamber can affect the dimensional stability and performance of wafer support components, leading to inaccuracies in positioning and imaging.

Accordingly, there is a need for a wafer support system that avoids the use of wafer support materials that outgas in vacuum environments and contaminate semiconductor samples and degrade imaging quality.

There is also a need for a wafer support system that avoids the use of wafer support mechanisms that cause reduced performance or failure due to vacuum-induced stress or deformation.

There is also a need for a wafer support system that provides a more open pumping route for the backside of the wafer in order to allow for efficient removal of outgassed particles and minimizing the risk of contamination propagation.

There is also a need for a wafer support system that avoids the use of support components that can generate friction or particulate contamination, which compromises imaging accuracy and cleanliness in ultra-clean vacuum environments.

There is also a need for a wafer support system that avoids variations in temperature within a vacuum chamber which can affect the dimensional stability and performance of wafer support components, which in turn can lead to inaccuracies in positioning and imaging.

SUMMARY OF THE INVENTIVE CONCEPT

The present inventive concept provides a specifically designed universal ring wafer support apparatus. More particularly, but not exclusively, the present inventive concept provides a universal ring wafer support apparatus that can receive and support various size wafers, ensures robust grounding of wafers, minimizes outgassing-related issues and mitigates risks of contamination transfer in order to enhance reliability and cleanliness of semiconductor fabrication processes.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a universal ring wafer support apparatus, including: a circular main body; a circular shaped raised section extending upward from the main body along an outer circumference thereof, the circular shaped raised section including a first outer contact material extending along a top portion thereof to support a wafer having a first diameter and a second inner contact material extending along a top portion thereof to support a wafer having a second diameter smaller than the wafer having a first diameter; a circular raised island disposed at and extending upward from the center of the main body and including a third contact material extending along a circumference thereof and a hole extending into a center thereof; at least one groove disposed to extend through the circular raised portion to create at least one break through the circular raise portion; and a plurality of vent holes formed through the main body and configured to surround the circular raised island.

In an example embodiment, the main body, circular shaped raised section and circular raised island are formed of an aluminum alloy.

In another example embodiment, the aluminum alloy is AL 6061-T6.

In an example embodiment, first outer contact material and the second inner contact material extending along a top portion of the circular shaped raised section and the third contact material extending along a circumference circular raised island are formed of an elastomer polymer with a 7N (newton) hold force on the X and Y axis and a 0.1N (newtons) hold force on the Z-axis.

In still another example embodiment, a back surface thereof can include at least three knurled fine adjustable thread risers evenly and circumferentially spaced about an outer portion thereof to mechanically level the universal ring wafer support In yet another example embodiment, the universal ring wafer support apparatus can further include a spring extending into the hole extending into the center of the circular raised island; and a grounding actuator nose disposed over the hole and engaged with the spring.

The foregoing and/or other features and utilities of the present general inventive concept may also be achieved by providing a universal ring wafer support apparatus, including: a circular main body; a first outer circular shaped raised section extending upward from the main including a first contact material extending along a top portion thereof to support a wafer having a first diameter; a second inner circular shaped raised section extending upward from the main body and disposed within the perimeter of the first circular shaped raised section, the second inner circular shaped raised section including a second contact material extending along a top portion thereof to support a wafer having a second diameter smaller than the wafer having the first diameter; at least one groove disposed to extend through the first outer circular shaped raised section and through the second inner circular shaped raised section to create at least one break through the first outer circular shaped raised portion and the second inner circular shaped raised section; a circular raised island disposed at and extending upward from the center of the main body and including a third contact material extending along a circumference thereof and a hole extending into a center thereof; and a plurality of vent holes formed through the main body and configured to surround the circular raised island.

In an example embodiment, the main body, the first outer circular shaped raised section, the second inner circular shaped raised section and the circular raised island are formed of an aluminum alloy.

In another example embodiment, the aluminum alloy is AL 6061-T6.

In another example embodiment, the first contact material, the second contact material and the third contact material are formed of an elastomer polymer with a 7N (newton) hold force on the X and Y axis and a 0.1N (newtons) hold force on the Z-axis.

In still another example embodiment, a back surface thereof comprises at least three knurled fine adjustable thread risers evenly and circumferentially spaced about an outer portion thereof to mechanically level the universal ring wafer support.

In yet another example embodiment, the universal ring wafer support apparatus can further include a spring extending into the hole extending into the center of the circular raised island; and a grounding actuator nose disposed over the hole and engaged with the spring.

The foregoing and/or other features and utilities of the present general inventive concept may also be achieved by providing a universal ring wafer support apparatus, including: a circular main body; a first outer circular shaped raised section extending upward from the main including a first set of pucks disposed along a top portion thereof to support and grip a wafer having a first diameter; a second inner circular shaped raised section extending upward from the main body and disposed within the perimeter of the first circular shaped raised section, the second inner circular shaped raised section including: a second set of pucks disposed along an outer perimeter of a top portion thereof to support a wafer having a second diameter smaller than the first diameter; and a third set of pucks disposed along an inner perimeter of the top portion thereof to support a wafer having a third diameter smaller than the second diameter; at least one groove disposed to extend through the first outer circular shaped raised section and through the second inner circular shaped raised section to create at least one break through the first outer circular shaped raised portion and the second inner circular shaped raised section; a circular raised island disposed at and extending upward from the center of the main body and including at least one four puck disposed along a top portion thereof and a hole extending into a center thereof; and a plurality of vent holes formed through the main body and configured to surround the circular raised island.

In an example embodiment, the universal ring wafer support apparatus can further include: a spring extending into the hole extending into the center of the circular raised island; and a grounding actuator nose disposed over the hole and engaged with the spring, the grounding actuator nose being configured to ground a wafer in contact therewith.

In another example embodiment, the first outer circular shaped raised section includes a plurality of grooves formed into a top portion thereof to receive and secure a corresponding puck therein; the second inner circular shaped raised section includes a plurality of grooves formed into a top portion thereof to receive and secure a corresponding puck therein; and the circular raised island includes at least one groove formed into a top portion thereof to receive and secure a corresponding puck therein.

In another example embodiment, the first, second, third and four pucks are formed of an elastomer polymer with a 7N (newton) hold force on the X and Y axis and a 0.1N (newtons) hold force on the Z-axis.

In still another example embodiment, the main body, the first outer circular shaped raised section, the second inner circular shaped raised section and the circular raised island are formed of an aluminum alloy.

In another example embodiment, the main body is formed of AL 6061-T6.

In still another example embodiment, the universal ring wafer support apparatus can further include a back surface thereof comprises at least three knurled fine adjustable thread risers evenly and circumferentially spaced about an outer portion thereof to mechanically level the universal ring wafer support.

Additional features and utilities of the present general inventive concept will be set forth in part in the description which follows and, in part, will be obvious from the description, or may be learned by practice of the general inventive concept.

BRIEF DESCRIPTION OF THE DRAWINGS

These and/or other features and utilities of the present inventive concept will become apparent and more readily appreciated from the following description of the embodiments, taken in conjunction with the accompanying drawings of which.

The drawings illustrate a few example embodiments of the present inventive concept and are not to be considered limiting in its scope, as the overall inventive concept may admit to other equally effective embodiments. The elements and features shown in the drawings are to scale and attempt to clearly illustrate the principles of exemplary embodiments of the present inventive concept. In the drawings, reference numerals designate like or corresponding, but not necessarily identical, elements throughout the several views.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Also, while describing the present general inventive concept, detailed descriptions about related well-known functions or configurations that may diminish the clarity of the points of the present general inventive concept are omitted.

It will be understood that although the terms "first" and "second" are used herein to describe various elements, these elements should not be limited by these terms. These terms are only used to distinguish one element from another element. Thus, a first element could be termed a second element, and similarly, a second element may be termed a first element without departing from the teachings of this disclosure.

Expressions such as "at least one of," when preceding a list of elements, modify the entire list of elements and do not modify the individual elements of the list.

All terms including descriptive or technical terms which are used herein should be construed as having meanings that are obvious to one of ordinary skill in the art. However, the terms may have different meanings according to the intention of the lexicographer, case precedents, or the appearance of new technologies. Also, some terms may be arbitrarily selected by the inventors, and in this case, the meaning of the selected terms will be described in detail in the detailed description herein. Thus, the terms used herein should be defined based on the generally defined meaning of the terms together with the description throughout this specification.

Hereinafter, one or more exemplary embodiments of the present general inventive concept will be described in detail with reference to accompanying drawings.

Example embodiments of the present general inventive concept are directed to a specifically configured universal ring wafer support system. More particularly, but not exclusively, the present inventive concept relates to a universal ring wafer support system that ensures robust grounding of wafers, minimizes outgassing-related issues and mitigates risks of contamination transfer to enhance reliability and cleanliness of semiconductor fabrication processes.

The disclosed ultra-precision mechanical universal ring wafer supports, according to example embodiments of the present inventive concept, provide an unwavering commitment to mechanical precision. These present inventive universal ring wafer supports according to the example embodiments of the present inventive concept are engineered to exact tolerances, ensuring submicron-level accuracy in wafer placement and alignment. Through the integration of precision components and advanced machining techniques, these mechanical universal ring wafer supports facilitate the attainment of reproducible results across successive operations, underpinning the reliability and consistency of semiconductor fabrication processes. Beyond their role as mere fixtures, the present inventive ultra-precision mechanical universal ring wafer supports embody versatility and adaptability, catering to the diverse array of processes and requirements encountered within semiconductor fabrication facilities. Whether accommodating different wafer sizes, materials, or processing techniques, these universal ring wafer supports offer flexibility and customization to suit the evolving needs of semiconductor manufacturers. The modular designs and adjustable configurations of the present inventive mechanical universal ring wafer supports empower fabrication facilities with the agility to navigate technological advancements and process innovations with ease. The balancing of cost-effectiveness and performance and reliability of the present inventive universal ring wafer supports is essential for ensuring the widespread adoption of Z-stage technologies in semiconductor microscopy. The design of the present inventive universal ring wafer supports is configured to take into account critical conditions such as material outgassing, mechanical integrity, precision, cost, contamination concerns, and EMI in order to adjust the current technologies for SEM wafer handling to improve overall performance.

Figures 6, 6A, 6B:
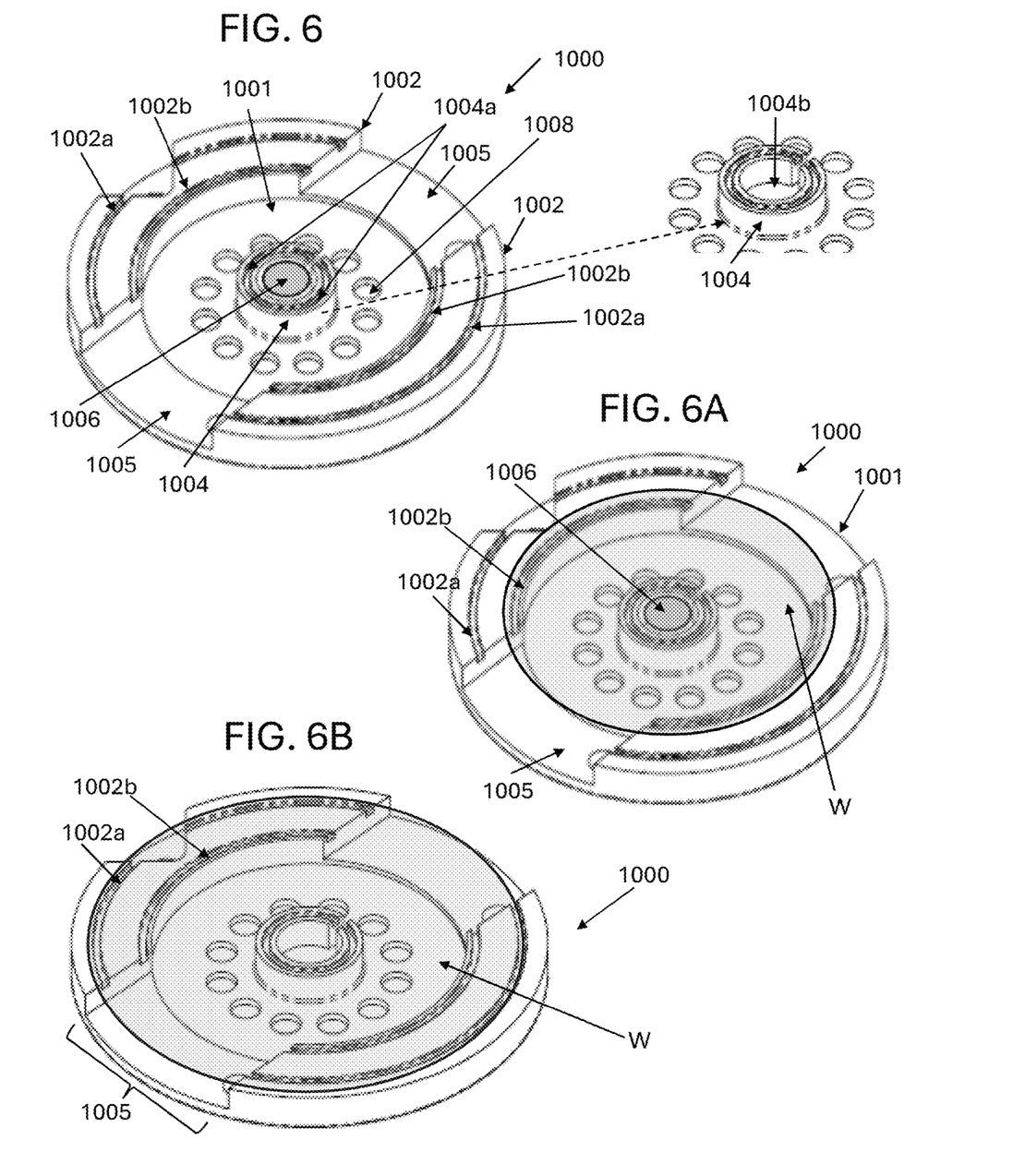
FIG. 6 illustrates an elevated plan view of a universal ring wafer support, according to an example embodiment of the present inventive concept.
FIG. 6A illustrates an elevated plan view of the universal ring wafer support according to FIG. 6, while operationally supporting a wafer of a smaller size.
FIG. 6B illustrates an elevated plan view of the universal ring wafer support according to FIG. 6, while operationally supporting a wafer of a larger size.

FIG. 6 illustrates an elevated plan view of a universal ring wafer support 1000, according to an example embodiment of the present inventive concept. The universal ring wafer support 1000 can include a main body 1001 formed of a highly conductive material, such as, for example AL 6061-T6 (aluminum alloy) material. The universal ring wafer support 1000 can also include circular shaped raised sections 1002 disposed around outer portions of the main body 1001 and a contact material 1002a, having a significant gripping force, extending along a top surface of the circular shaped raised sections 1002. An example of a material that can be used for the contact material 1002a is a special elastomer polymer with a 7N (newton) hold force on the X and Y axis and a 0.1N (newtons) hold force on the Z-axis, nullifying any displacement between the wafer chuck and the wafer. It is to be noted that other equivalent materials that can be used for the contact material 1002a can be, for example polyurethane, silicone, rubber or a thermoplastic elastomer (TPE). Further, the universal ring wafer support 1000 according to the present example embodiment can also include a centrally disposed raised island (aka: a wafer grounding shroud) 1004, a contact material 1004a, having a significant gripping force, extending along a top surface of the island 1004, and a centrally formed hole 1004b extending through the raised island 1004. The raised island 1004 and contact material 1004a together are configured to provide a seat as well as a strong gripping force for a wafer W disposed thereon. An example of a material that can be used for the contact material 1004a is a special elastomer polymer with a 7N (newton) hold force on the X and Y axis and 0.1N (newtons) hold force on the Z-axis, nullifying any displacement between the wafer chuck and the wafer. Other equivalent materials that can be used for the contact material 1004a can be, for example polyurethane, silicone, rubber or a thermoplastic elastomer (TPE).

The universal ring wafer support 1000 according to the present example embodiment can also include grooves 1005 disposed to extend through the circular raised sections 1002 to create a break or breaks in the circular raised sections 1002, a wafer grounding actuator nose 1006 disposed over the central formed hole 1004b, and a plurality of vent holes 1008 disposed around the centrally disposed raised island 1004.

This universal ring wafer support 1000 preferably includes the following configurations: the contact material 1002a extending along a top surface of the circular shaped raised sections 1002 is provided to receive wafers with the following specifications: D1520: 150 mm and 200 mm wafers. The contact material 1002b extending along a top surface of the circular shaped raised sections 1002 is provided to receive wafers with the following specifications: D1520: 150, and 200 mm wafers. However, the diameters of the circular raised sections 1002, as well as the contact material 1002a disposed around an outer edge of the circular raised sections 1002, and the contact material 1002b disposed around the inner edge of the circular raised sections 1002, as well as the raised island and corresponding contact material 1004a can be configured to receive, support and securely retain wafers of difference sizes as may be desired. An example of a material that can be used for the contact material 1002a, 1002b and 1004a is a special elastomer polymer with a 7N (newton) hold force on the X and Y axis and 0.1N (newtons) hold force on the Z-axis, nullifying any displacement between the wafer chuck and the wafer. Other equivalent materials that can be used for the contact material 1002a, 1002b, and 1004a can be, for example polyurethane, silicone, rubber or a thermoplastic elastomer (TPE).

FIGS. 6A and 6B illustrate an elevated plan views of the universal ring wafer support 1000 in an operational state of supporting different size wafers W placed on the circular raised sections 1002 and secured in place by either the contact material 1002b or the contact materials 1002a and 1002b together, depending on the desired diameter of the wafer(s) being processed. For example, FIG. 6A illustrates where a 150 mm wafer W is placed on a D1520 size support, where the contact materials 1002b and 1004a receive, support and secure the wafer W in place, and FIG. 6B illustrates where a 200 mm wafer is placed on the D1520 size support, where the contact materials 1002a, 1002b and 1004a receive, support and secure the larger size wafer W in place. It is to be noted that depending on the size of the wafer being supported, the chuck elevation will be different due to the Z-gripper position, as different diameter wafers have different thicknesses.

This universal ring wafer support 1000, according to the present embodiment, is configured to be mountable to a standard Z-Stage or Rotation Stage using three fine-thread Ti leveling screws. However, a different number of, and a different placement thereon, can be used without departing from the spirit and scope of the overall present inventive concept.

The materials used in the universal ring wafer support main body 1001 and circular raised sections 1002 can comprise Al 6061-T6 high conductivity material. The contact material 1002a, 1002b and 1004a can be formed of a proprietary blend of softer material(s) with a significant gripping force. As pointed out above, other equivalent materials that can be used for the contact material 1002a, 1002b and 1004a can be, for example polyurethane, silicone, rubber or a thermoplastic elastomer (TPE).

The grooves 1005 that are disposed through the circular raised sections 1002 provide an opening for vacuum air to flow from the top of the universal ring wafer support 1000 through the plurality of vent holes 1008 disposed around the centrally disposed raised island 1004 to below the universal ring wafer support 1000, thus enabling dust, particles and other contaminants to flow away from the wafer and through the plurality of vent holes 1008 to keep the dust, particles and contaminants away from the wafers. The grooves 1005 are also provided to enable a wafer placement tool (a vacuum tool used for holding and transporting a wafer), to be inserted therein to place each wafer W over the contact material 1002a, 1002b and 1004a, or over the contact material 1002b and 1004a (for smaller size wafers W). Once a wafer W is placed over the contact material 1002a, 1002b and 1004a, or over the contact material 1002b and 1004a for a smaller size wafer W, the wafer placement tool releases the wafer W by lowering the wafer placement tool and sliding the tool out of the groove 1005.

Referring back to FIGS. 6 and 6A, the wafer ground actuator nose 1006, which is disposed over the central formed hole 1004b, is configured to ground the wafer W when the wafer W makes back-side contact with the ground actuator nose 1006. The ground actuator nose 1006 can be supported by a spring disposed within the central formed hole 1004b formed in the raised island 1004.

Figure 6C:
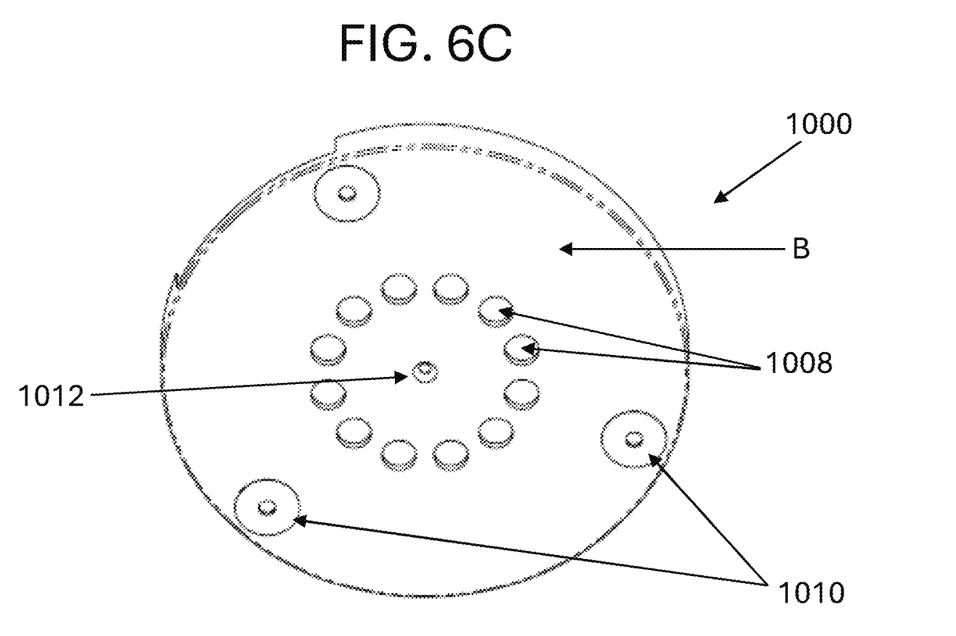
FIG. 6C illustrates an elevated plan view of a back side of the universal ring wafer support according to FIG. 6.

FIG. 6C illustrates an elevated view of a back side B of the universal ring wafer support 1000 according to the present example embodiment. The back side of the universal ring wafer support 1000 can include a predetermined number of knurled fine thread risers 1010. In this example embodiment there are three knurled fine thread risers 1010 evenly and circumferentially spaced about the outer portion of the back side of the universal ring wafer support 1000. The universal ring wafer support 1000 can be mechanically leveled by independently or simultaneously adjusting the three knurled fine thread risers 1010. It is to be noted that a different positioning, number of and spacing of knurled fine thread risers 1010 can be disposed on the back side B of the universal ring wafer support 1000 as desired, without departing from the spirit and scope of the overall present inventive concept.

Figure 7:
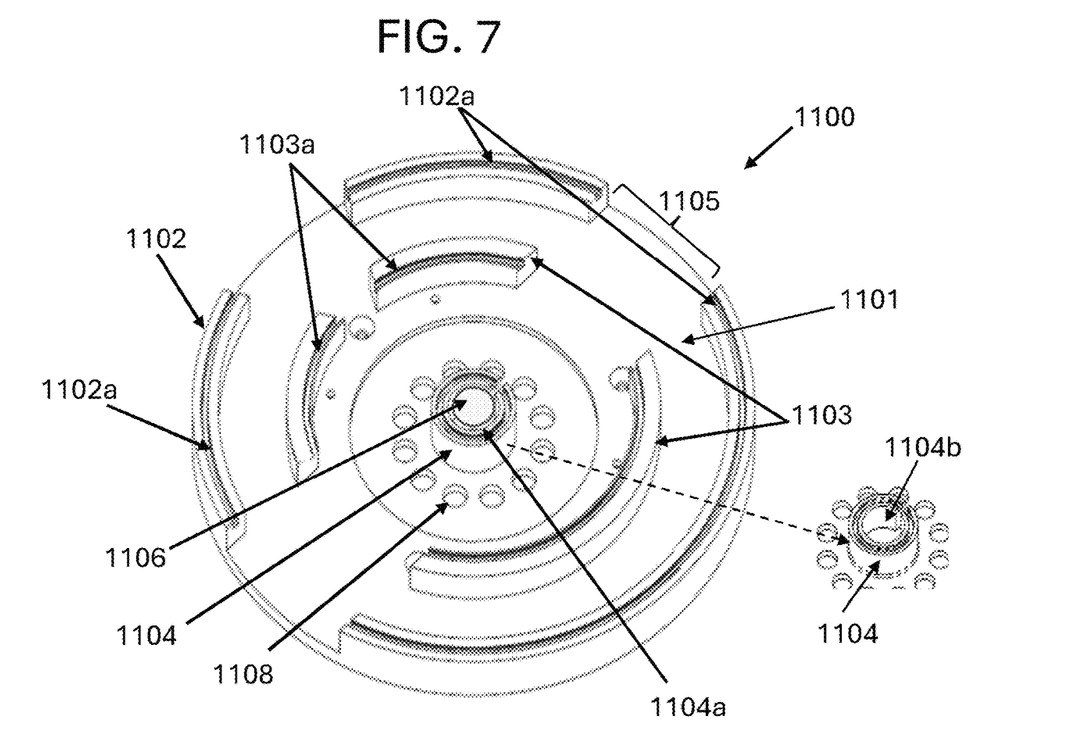
FIG. 7 illustrates an elevated plan view of a universal ring wafer support, according to another example embodiment of the present inventive concept.

FIG. 7 illustrates an elevated plan view of a universal ring wafer support 1100, according to another example embodiment of the present inventive concept. The universal ring wafer support 1100 according to this example embodiment can include a main body 1101 formed of a highly conductive material, such as, for example an AI 6061-T6 material. The universal ring wafer support 1100 can also include a circular shaped raised section 1102 disposed at an outer peripheral portion of the main body 1101 and a contact material 1102a, having a significant gripping force, extending along a top surface of the outer peripheral circular shaped raised section 1102. The universal ring wafer support 1100 can also include an inner circular shaped raised section 1103 disposed at approximately a middle circumferential portion of the main body 1101, and a contact material 1103a, having a significant gripping force, extending along a top surface of the inner circular shaped raised section 1103. The contact material 1003a can be formed of a proprietary blend of softer material(s) with a significant gripping force. As pointed out above, other equivalent materials that can be used for the contact material d 1003a can be, for example polyurethane, silicone, rubber or a thermoplastic elastomer (TPE).

The outer peripheral circular shaped raised section 1102 and the inner circular shaped raised section 1103 are configured to receive, support and securely grip different sized wafers W thereon. The universal ring wafer support 1100 can also include a centrally disposed raised island 1104, a contact material 1104a, having a significant gripping force, extending along a top surface of the island 1104, and a centrally formed hole 1104b extending into the raised island 1104. The centrally disposed raised island 1104 and contact material 1104a provide a seat as well as a strong gripping force for a wafer W when disposed thereon.

The universal ring wafer support 1100 according to this example embodiment can also include grooves 1105 disposed to extend through the circular raised sections 1102 and 1103, a wafer grounding actuator nose 1106 disposed over the central formed hole 1104b, and a plurality of vent holes 1108 disposed around the centrally disposed raised island 1104.

Figure 7A:
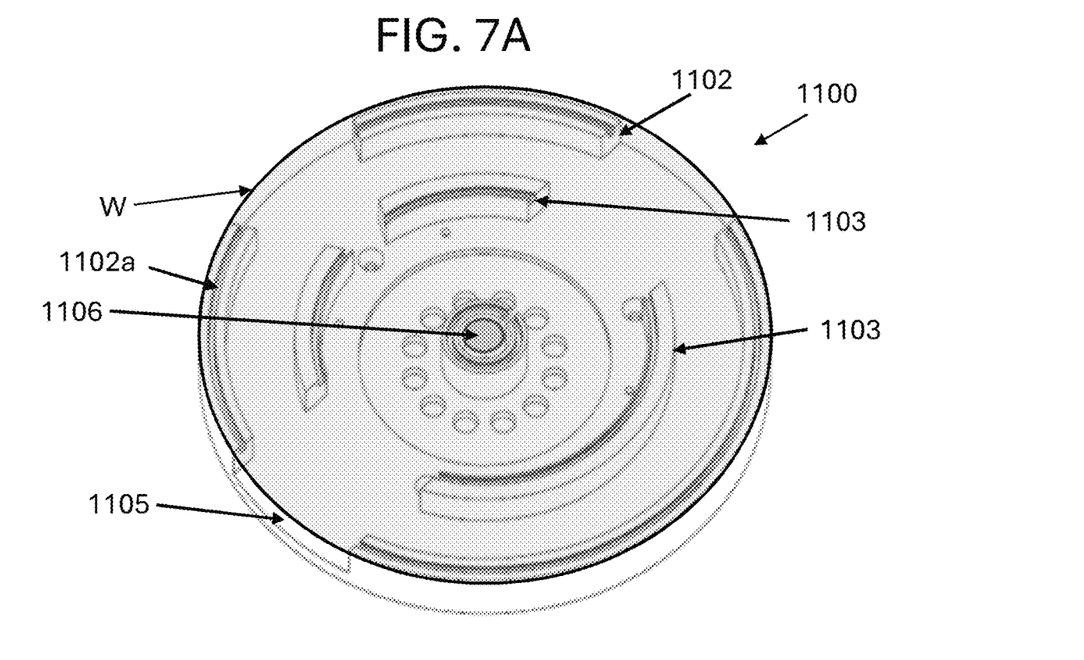
FIG. 7A illustrates an elevated plan view of the universal ring wafer support according to FIG. 7, while operationally supporting a wafer.

FIG. 7A illustrates an elevated plan view of the universal ring wafer support 1100 with a 300 mm wafer placed on a D2030 sized support. The D2030 support can securely receive and retain a 200 mm sized wafer W and a 300 mm sized wafer W thereon.

The grooves 1105 that are disposed through the circular raised sections 1102 and 1103 provide an opening for vacuum air to flow from the top of the universal ring wafer support 1100 through the plurality of vent holes 1108 disposed around the centrally disposed raised island 1104 to the bottom of the universal ring wafer support 1100, thus enabling dust, particles and any other contaminants to flow away from the wafer W and through the plurality of vent holes 1108 to keep the any dust, particles and contaminants away from the wafers W. The grooves 1105 are also provided to enable a wafer placement tool (generally a vacuum placement tool), used to hold and transport a wafer W thereon, to be inserted therein to place each wafer W over the contact material 1103a and 1104a (for smaller size wafers W), or over the contact material 1102a, 1103a and 1104a (for larger size wafers W). Once the wafer W is placed over the contact materials 1103a and 1104a (for smaller size wafers W), or contact materials 1102a, 1103a and 1104a (for larger size wafers W), the wafer placement tool can then release the wafer W by lowering the wafer placement tool and sliding the tool out of the groove(s) 1105. An example of a material that can be used for the contact materials 1102a, 1103a and 1104a is a special elastomer polymer with a 7N (newton) hold force on the X and Y axis and 0.1N (newtons) hold force on the Z-axis, allowing the stage to move at the same speed as an ESC. As pointed out above, other equivalent materials that can be used for the contact materials 1102a, 1103a and 1004a can be, for example polyurethane, silicone, rubber or a thermoplastic elastomer (TPE).

Still referring to FIG. 7, the wafer ground actuator nose 1106, which is disposed over the central formed hole 1104b, is configured to ground the wafer W when the wafer W makes back-side contact with the ground actuator nose 1106.

The ground actuator nose 1106 can be supported by a spring disposed within the central formed hole 1104b in the raised island 1104.

Figure 7B:
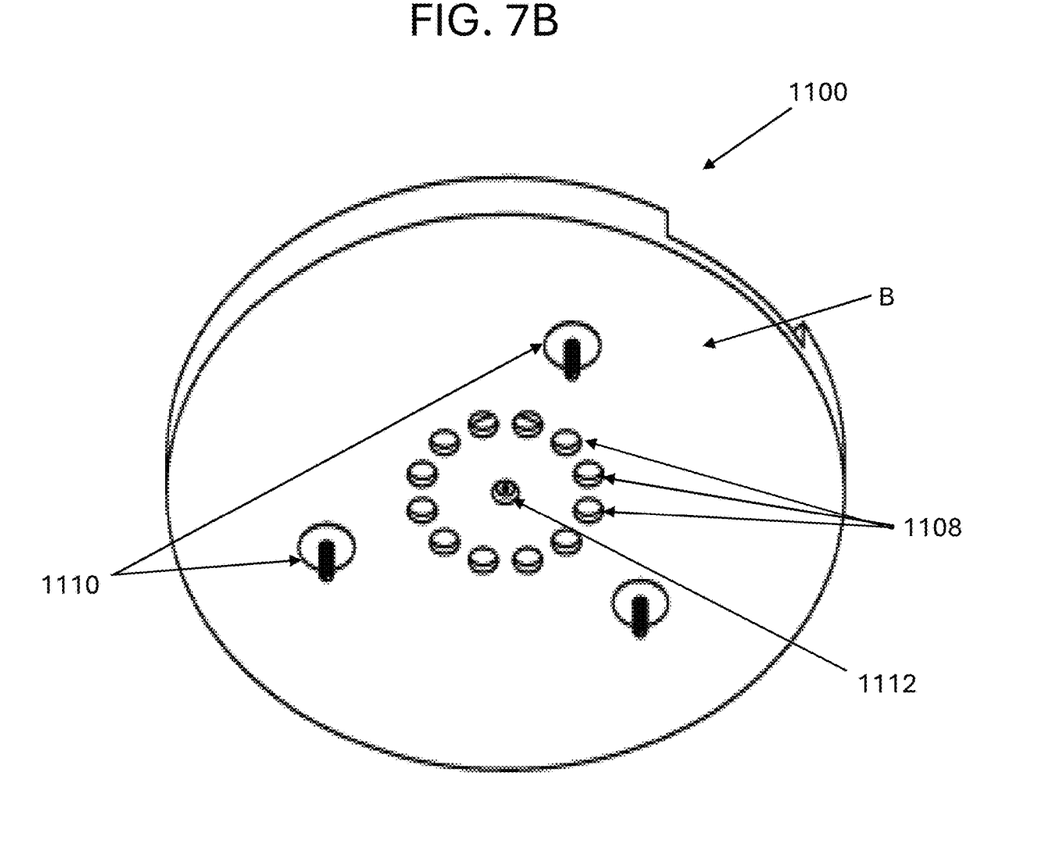
FIG. 7B an elevated plan view of a back side of the universal ring wafer support according to FIG. 7.

FIG. 7B illustrates an elevated plan view of a back side B of the universal ring wafer support 1100 according to the present example embodiment. The back side of the universal ring wafer support 1100 can include a predetermined number of knurled fine thread risers 1110. In this example embodiment there are three evenly spaced knurled fine thread risers 1110 evenly and circumferentially spaced about the middle portion of the back side B of the universal ring wafer support 1100. The universal ring wafer support 1100 can be mechanically leveled by adjusting the three knurled fine thread risers 1110.

Figure 8:
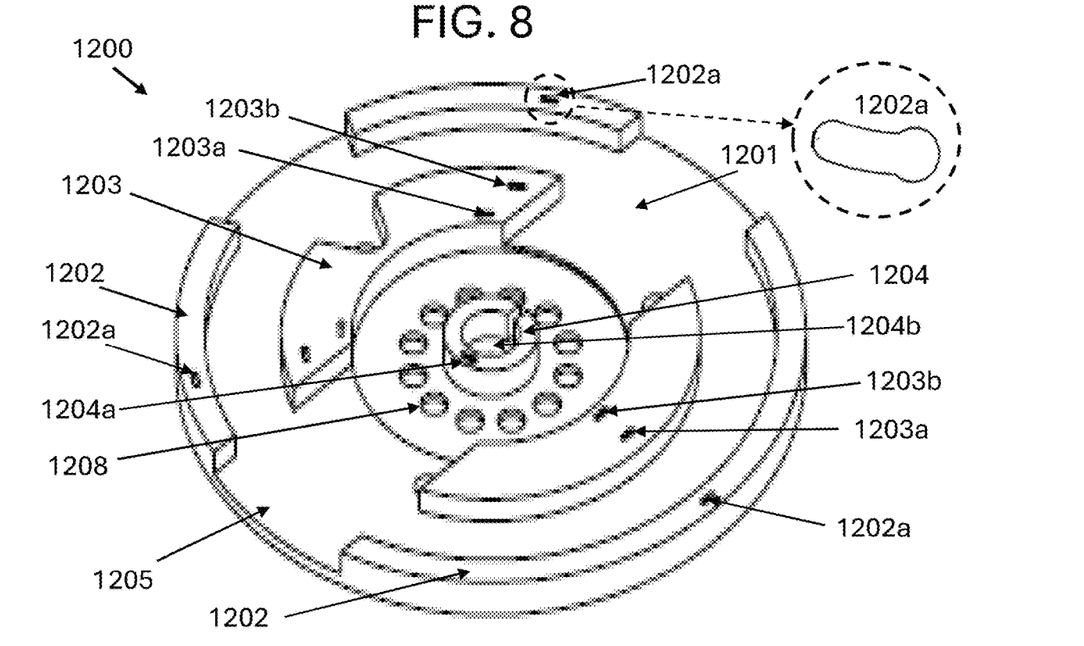
FIG. 8 illustrates an elevated plan view of a universal ring wafer support, according to still another example embodiment of the present inventive concept.

FIG. 8 illustrates an elevated plan view of a universal ring wafer support 1200 (which is referred to as a D1520230 support), according to still another example embodiment of the present inventive concept. The universal ring wafer support 1200 according to this example embodiment can include a main body 1201 formed of a highly conductive material, such as, for example an AI 6061-T6 material. The universal ring wafer support 1200 can also include a circular shaped raised section 1202 disposed at an outer peripheral portion of the main body 1201. Grooves 1202a can be formed into the top of the circular shaped raised section 1202. The grooves 1202a can be placed equal distances apart and can be formed in a keyhole type shape (see expanded view within the dotted circle), where one end of each groove 1202a includes a wider opening than the rest of the groove 1202a. The grooves 1202a are configured to receive "pucks" 1210 therein, as illustrated in FIGS. 8A and 9A-9C. More specifically, referring to FIGS. 9A-9C, the pucks 1210 can be formed to have a bottom end 1210b to be inserted into and slid along the grooves 1202a to be secured therein while a top end 1210a of each puck 1210 will sit above the surface of the circular raised section 1202 of the universal ring wafer support 1200 to receive and grip a wafer W thereon. The pucks 1210 can also include a hole 1210c formed through the center thereof to receive a tool T for placing the pucks 1210 into the respective groove 1202a and easily sliding the pucks 1210 along the groove 1202a. The pucks 1210 can be formed of a proprietary blend of softer material(s) with a significant gripping force. Other equivalent materials that can be used for the pucks 1210 can include, for example polyurethane, silicone, rubber or a thermoplastic elastomer (TPE).

Figure 9A:
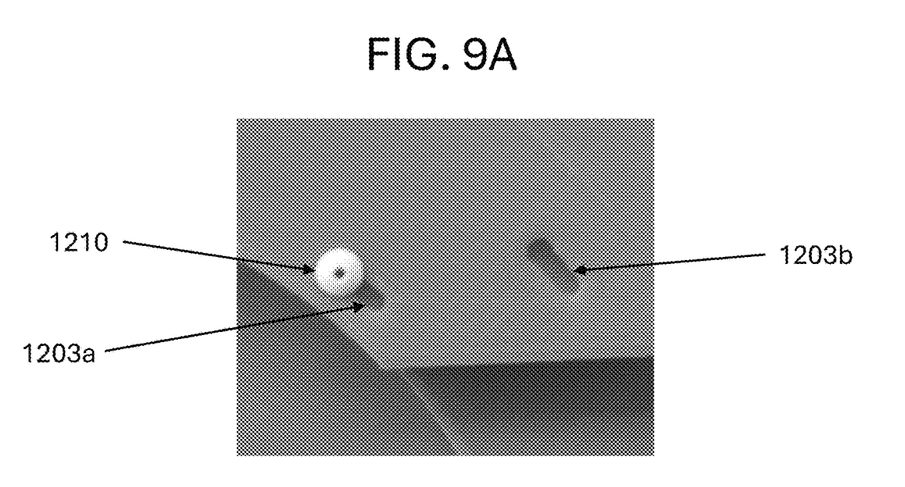
FIG. 9A illustrates a partial top view of the universal ring wafer support according to the example embodiment of FIGS. 8 and 8A, showing a puck inserted into a corresponding groove.
Figure 9B:
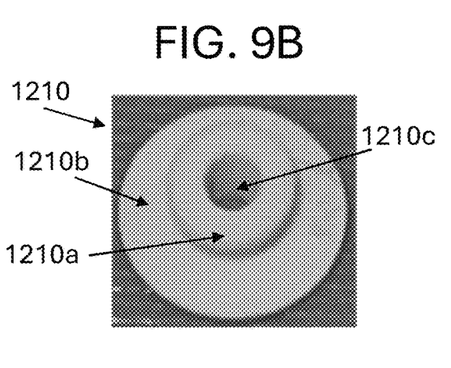
FIG. 9B illustrates a top view of a puck as illustrated in FIG. 9A.
Figure 9C:
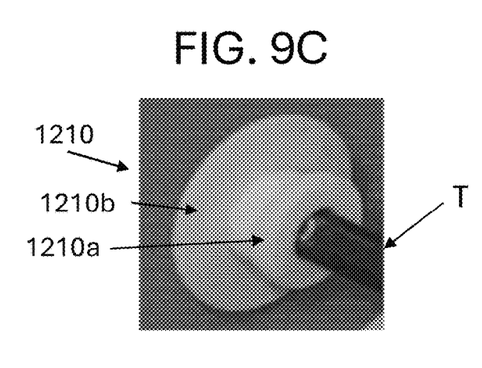
FIG. 9C illustrates a side view of a puck as illustrated in FIG. 9A.

Referring to FIGS. 8 and 9A, the grooves 1202a can be formed around the top surface of the circular raised section 1202 to have an elongated shape (i.e., keyhole shape) such that the inserted pucks 1210 can receive and grip a wafer W having a diameter of 300 mm.

The universal ring wafer support 1200 (aka: a D1520230 support) can also include an inner circular shaped raised section 1203 disposed at approximately a middle circumferential portion of the main body 1201. Inner grooves 1203a and outer grooves 1203b can be formed into the top of the circular shaped raised section 1203. The grooves 1203a and 1203b can also be formed in a keyhole type shape, as illustrated in FIGS. 8 and 9A. The grooves 1203a can be placed equal distances apart around an inner diameter of the circular raised section 1203 and the grooves 1203b can be placed equal distances apart around an outer diameter of the circular raised section 1203. Other shapes and positions of the grooves 1203a and 1203b can be provided which will provide the intended purposes as described herein, without departing from the overall spirit and scope of the present inventive concept.

Figure 8A:
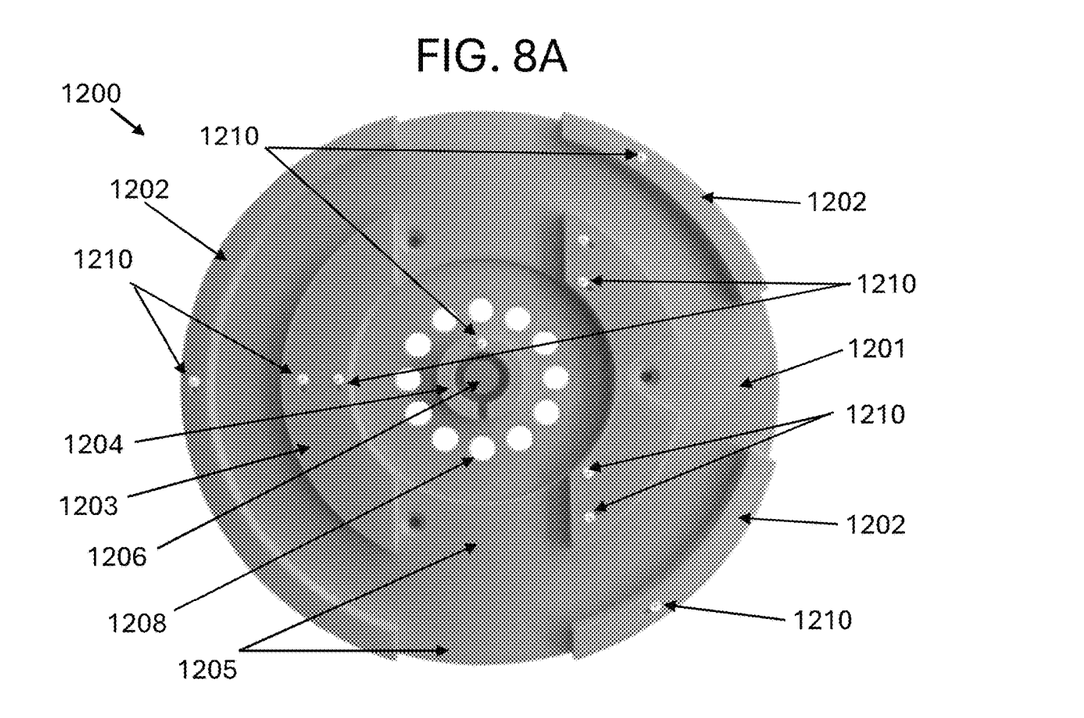
FIG. 8A illustrates a top view of the universal ring wafer support according to example embodiment of FIG. 8.

Similar to the grooves 1202a described above, the grooves 1203a and 1203b are also configured to receive and secure the flexible pucks 1210 therein, as illustrated in FIGS. 8A and 9A. The grooves 1203a can be formed around the inner top surface of the circular raised section 1203 to form a diameter such that the inserted pucks 1210 can be disposed therein to receive and grip a wafer W having a diameter of 150 mm. The grooves 1203a can also receive and grip wafers W having larger size diameters since the pucks 1210 secured in the respective grooves 1203a will make contact with wafers W having diameters of 150 mm and greater. The grooves 1203b can be formed around the outer top surface of the circular raised section 1203 to form a diameter such that the inserted pucks 1210 can be disposed to receive and grip a wafer W having a diameter of 200 mm. The grooves 1203b can also receive and grip wafers W having larger size diameters since the pucks 1210 secured in the respective grooves 1203b will make contact with wafers W having diameters of 200 mm and greater.

Figure 10A:
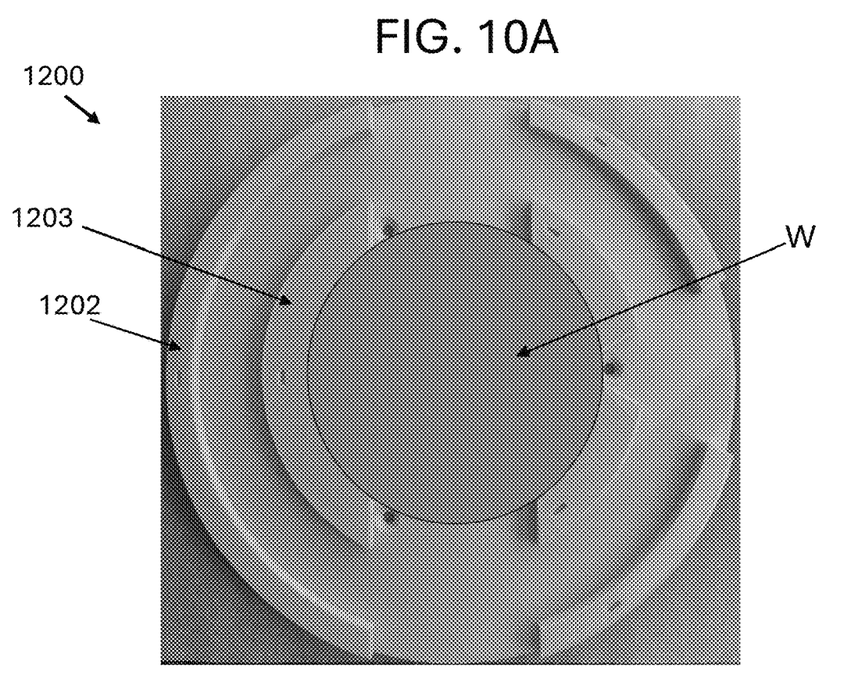
FIG. 10A illustrates a top view of the universal ring wafer support according to FIGS. 8 and 8A, while operationally supporting a wafer W having a diameter of 150 mm.
Figure 10B:
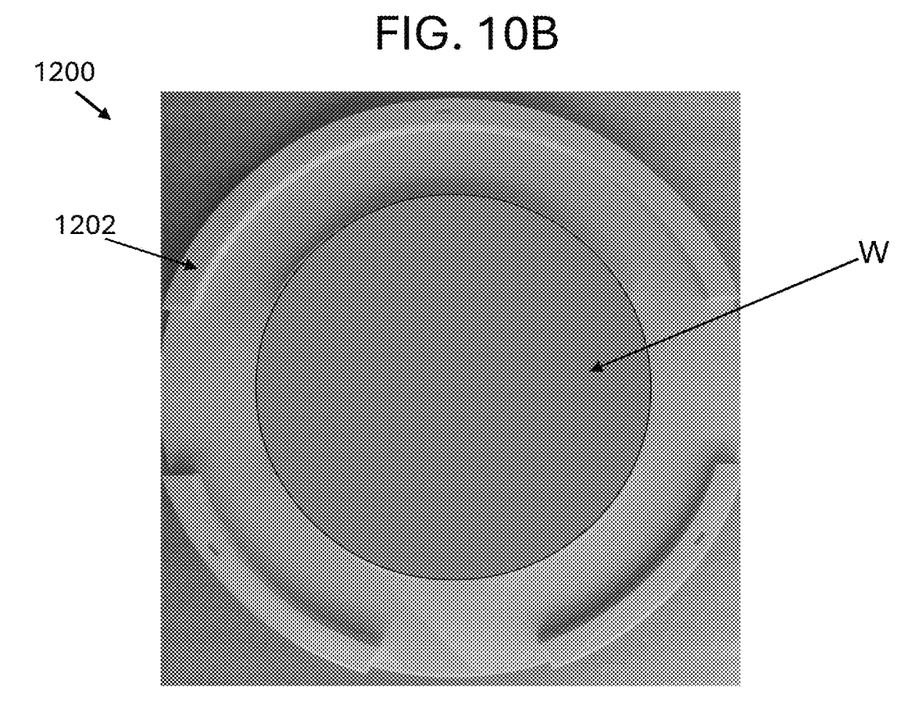
FIG. 10B illustrates a top view of the universal ring wafer support according to FIGS. 8 and 8A, while operationally supporting a wafer W having a diameter of 200 mm.
Figure 10C:
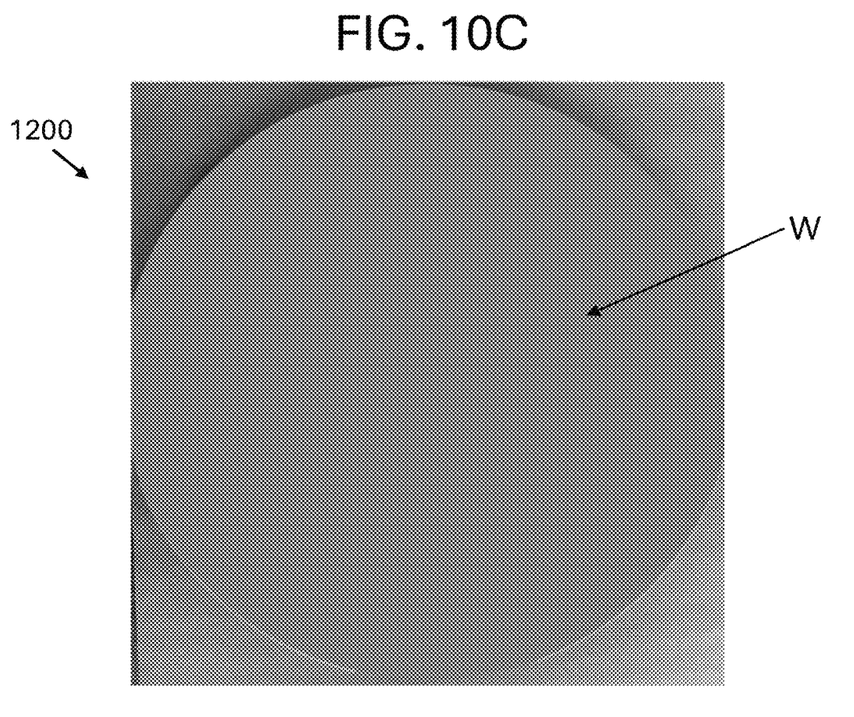
FIG. 10C illustrates a top view of the universal ring wafer support according to FIGS. 8 and 8A, while operationally supporting a wafer W having a diameter of 300 mm.

FIG. 10A illustrates the universal ring wafer support 1200 in operation while supporting a wafer W having a diameter of 150 mm, wherein an outer periphery of the 150 mm wafer W is resting on and gripped by pucks 1210 inserted into grooves 1203a. FIG. 10B illustrates the universal ring wafer support 1200 in operation while supporting a wafer W having a diameter of 200 mm, wherein an outer periphery of the 200 mm wafer W is resting on and gripped by pucks 1210 inserted into grooves 1203b. Here the 200 mm wafer W will also be resting on and gripped by pucks 1210 inserted into grooves 1203a. FIG. 10C illustrates the universal ring wafer support 1200 in operation while supporting a wafer W having a diameter of 300 mm, wherein an outer periphery of the 300 mm wafer W is resting on and gripped by pucks 1210 inserted into grooves 1202a. Here the 300 mm wafer W will also be resting on and gripped by pucks 1210 inserted into grooves 1203a and grooves 1203b.

The universal ring wafer support 1200 can also include a centrally disposed raised island 1204 (also referred to as a "wafer grounding puck shroud"). The centrally disposed raised island 1204 preferably includes a centrally formed hole 1204b extending therein. The centrally disposed raised island 1204 can also include at least one groove 1204a formed into the top thereof. The one or more grooves 1204a can also be formed in a keyhole type shape, similar to the grooves 1202a and 1203a-1203b formed into the circular raised sections 1202 and 1203, respectively.

Referring to FIG. 8A, the universal ring wafer support 1200 according to this example embodiment can also include grooves 1205 disposed to extend through the circular raised sections 1202 and 1203 and a wafer grounding actuator nose 1206 disposed over the centrally formed hole 1204b. The wafer grounding actuator nose 1206 can be supported by a spring (not illustrated) inserted into the hole 1204b and is configured to ground a wafer W in contact therewith. The universal ring wafer support 1200 according to this example embodiment can also include and a plurality of vent holes 1208 disposed around the centrally disposed raised island 1204.

The grooves 1205 that are disposed through the circular raised sections 1202 and 1203 provide an opening for vacuum air to flow from the top of the universal ring wafer support 1200 through the plurality of vent holes 1208 disposed around the centrally disposed raised island 1204 to the bottom of the universal ring wafer support 1200, thus enabling dust, particles and any other contaminants to flow away from the wafer W and through the plurality of vent holes 1208 to keep the any dust, particles and contaminants away from the wafers W. The grooves 1205 are also provided to enable a wafer placement tool (generally a vacuum placement tool), used to hold and transport a wafer W thereon, to be inserted therein to place each wafer W over the pucks 1210 disposed in the grooves 1202*a*, 1203*a*, 1203*b* and 1204*a* (for 300 mm wafers W), or over the pucks 1210 disposed in the grooves 1203*a*, 1203*b* and 1204*a* (for 200 mm wafers W), or over pucks 1210 disposed in grooves 1203*a* and 1204*a* (for 150 mm wafers W). Once the wafer W is placed over the corresponding pucks 1210, the wafer placement tool can then be released from the wafer W and slid out of the groove(s) 1205.

Figure 11:
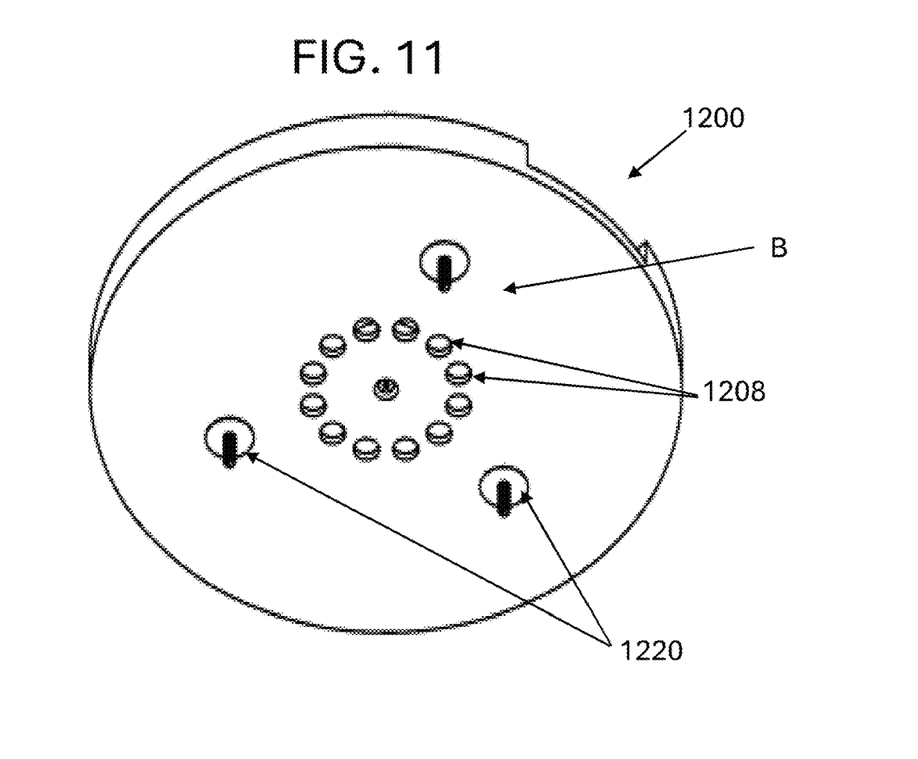
FIG. 11 illustrates an elevated plan view of a back side of the universal ring wafer support according to the example embodiment of FIGS. 8 and 8A.

FIG. 11 illustrates a back side B of the universal ring wafer support 1200 (aka: a D1520230 support). Similar to the universal ring wafer supports 1000 and 1100 according to the example embodiments of FIGS. 6 and 7, respectively, the back side of the universal ring wafer support 1200 can include a predetermined number of knurled fine thread risers 1220. In this example embodiment there are three knurled fine thread risers 1220 evenly and circumferentially spaced about the middle portion of the back side B of the universal ring wafer support 1200. The universal ring wafer support 1200 can be mechanically leveled by adjusting the three knurled fine thread risers 1220.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

The invention claimed is:

1. A universal ring wafer support apparatus, comprising:
a circular main body;
a first outer circular shaped raised section extending upward from the main body along an outer peripheral portion thereof, the first outer circular shaped raised section including a first set of pucks disposed along a top portion thereof to support and grip a wafer having a first diameter;
a second inner circular shaped raised section extending upward from the main body and disposed within the perimeter of the first circular shaped raised section, the second inner circular shaped raised section including:
a second set of pucks disposed along an outer perimeter of a top portion thereof to support a wafer having a second diameter smaller than the first diameter; and
a third set of pucks disposed along an inner perimeter of the top portion thereof to support a wafer having a third diameter smaller than the second diameter;
at least one groove disposed to extend through the first outer circular shaped raised section and through the second inner circular shaped raised section to create at least one break through the first outer circular shaped raised portion and the second inner circular shaped raised section to receive a wafer placement tool therein;
a circular raised island disposed at and extending upward from a center of the main body and including at least one fourth puck disposed along a top portion thereof and a hole extending into a center thereof; and
a plurality of vent holes formed through the main body and configured to surround the circular raised island to vent dust particles and contaminants away from a wafer placed on at least one of the first set of pucks, the second set of pucks and the third set of pucks.

2. The universal ring wafer support apparatus according to claim 1, further comprising:
a spring extending into the hole extending into the center of the circular raised island; and
a grounding actuator nose disposed over the hole and engaged with the spring, the grounding actuator nose being configured to ground a wafer in contact therewith.

3. The universal ring wafer support apparatus according to claim 1, wherein:
the first outer circular shaped raised section includes a plurality of grooves formed into a top portion thereof to receive and secure a corresponding puck therein;
the second inner circular shaped raised section includes a plurality of grooves formed into a top portion thereof to receive and secure a corresponding puck therein; and
the circular raised island includes at least one groove formed into a top portion thereof to receive and secure a corresponding puck therein.

4. The universal ring wafer support apparatus according to claim 3, wherein the first, second, third and four pucks are formed of an elastomer polymer with a 7N (newton) hold force on the X and Y axis and a 0.1N (newtons) hold force on the Z-axis.

5. The universal ring wafer support apparatus according to claim 1, wherein the main body, the first outer circular shaped raised section, the second inner circular shaped raised section and the circular raised island are formed of an aluminum alloy.

6. The universal ring wafer support apparatus according to claim 5, wherein the aluminum alloy is AL 6061-T6.

7. The universal ring wafer support apparatus according to claim 1, wherein a back surface thereof comprises at least three knurled fine adjustable thread risers evenly and circumferentially spaced about an outer portion thereof to mechanically level the universal ring wafer support apparatus.

* * * * *